United States Patent
Watanabe et al.

(10) Patent No.: US 11,501,976 B2
(45) Date of Patent: Nov. 15, 2022

(54) SUBSTRATE PROCESSING METHOD AND SUBSTRATE PROCESSING APPARATUS

(71) Applicant: Tokyo Electron Limited, Tokyo (JP)

(72) Inventors: Seiichi Watanabe, Miyagi (JP); Kazuki Narishige, Singapore (SG); Xinhe Jerry Lim, Singapore (SG); Jianfeng Xu, Singapore (SG); Yi Hao Ng, Miyagi (JP); Zhenkang Max Liang, Singapore (SG); Yujun Nicholas Loo, Singapore (SG); Chiew Wah Yap, Singapore (SG); Bin Zhao, Singapore (SG); Chai Jin Chua, Singapore (SG); Takehito Watanabe, Miyagi (JP); Koji Kawamura, Miyagi (JP); Kenji Komatsu, Miyagi (JP); Li Jin, Miyagi (JP); Wee Teck Tan, Singapore (SG); Dali Liu, Singapore (SG)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/179,436

(22) Filed: Feb. 19, 2021

(65) Prior Publication Data
US 2021/0265170 A1    Aug. 26, 2021

(30) Foreign Application Priority Data

Feb. 20, 2020 (JP) .............................. JP2020-026863

(51) Int. Cl.
*H01L 21/311* (2006.01)
*H01L 21/67* (2006.01)
(Continued)

(52) U.S. Cl.
CPC .... *H01L 21/31116* (2013.01); *H01J 37/3244* (2013.01); *H01J 37/32146* (2013.01);
(Continued)

(58) Field of Classification Search
None
See application file for complete search history.

(56) References Cited

U.S. PATENT DOCUMENTS 5,737,177 A * 4/1998 Mett ................... H01L 21/6833
279/128
10,515,782 B2 * 12/2019 Donnelly .......... H01J 37/32036
(Continued)

FOREIGN PATENT DOCUMENTS

JP    2019-009259 A    1/2019

*Primary Examiner* — Shamim Ahmed
(74) *Attorney, Agent, or Firm* — Xsensus LLP (57) ABSTRACT

A substrate processing method performed in a chamber of a substrate processing apparatus is provided. The chamber includes a substrate support, an upper electrode, and a gas supply port. The substrate processing method includes (a) providing the substrate on the substrate support; (b) supplying a first processing gas into the chamber; (c) continuously supplying an RF signal into the chamber while continuously supplying a negative DC voltage to the upper electrode, to generate plasma from the first processing gas in the chamber; and (d) supplying a pulsed RF signal while continuously supplying the negative DC voltage to the upper electrode, to generate plasma from the first processing gas in the chamber. The process further includes repeating alternately repeating the steps (c) and (d), and a time for performing the step (c) once is 30 second or shorter.

17 Claims, 9 Drawing Sheets

(51) Int. Cl.
    *H01L 21/683* (2006.01)
    *H01J 37/32* (2006.01)
    *H01L 21/768* (2006.01)

(52) U.S. Cl.
    CPC .. *H01J 37/32715* (2013.01); *H01L 21/31144* (2013.01); *H01L 21/67069* (2013.01); *H01L 21/6831* (2013.01); *H01L 21/76805* (2013.01); *H01J 2237/004* (2013.01); *H01J 2237/334* (2013.01)

(56) References Cited

U.S. PATENT DOCUMENTS

| | | | |
|---|---|---|---|
| 2006/0066247 A1* | 3/2006 | Koshiishi | H01J 37/3244 315/111.21 |
| 2017/0250056 A1* | 8/2017 | Boswell | H02M 3/33507 |
| 2020/0111645 A1* | 4/2020 | Koshiishi | H01J 37/32834 |

* cited by examiner

SUBSTRATE PROCESSING METHOD AND SUBSTRATE PROCESSING APPARATUS

CROSS-REFERENCE TO RELATED APPLICATION

This application is based on and claims priority from Japanese Patent Application No. 2020-026863, filed on Feb. 20, 2020, with the Japan Patent Office, the disclosure of which is incorporated herein in its entirety by reference.

TECHNICAL FIELD

The present disclosure relates to a substrate processing method and a substrate processing apparatus.

BACKGROUND

A technology is known which prepares a substrate having a plurality of base layers positioned at different heights and a target film formed on the plurality of base layers, and forms holes with different depths in the target film by using a mask having a plurality of openings positioned above the base layers, respectively, through an etching (see, e.g., Japanese Laid-Open Patent Publication No. 2019-009259).

SUMMARY

According to an aspect of the present disclosure, a substrate processing method performed in a chamber of a substrate processing apparatus is provided. The chamber includes a substrate support configured to place a substrate thereon, an upper electrode provided to face the substrate support, and a gas supply port configured to supply a processing gas into the chamber. The substrate processing method includes (a) providing the substrate on the substrate support; (b) supplying a first processing gas into the chamber; (c) continuously supplying an RF signal into the chamber while continuously supplying a negative DC voltage to the upper electrode, to generate plasma from the first processing gas in the chamber; and (d) supplying a pulsed RF signal while continuously supplying the negative DC voltage to the upper electrode, to generate plasma from the first processing gas in the chamber. The process further includes alternately repeating the steps (c) and (d), and a time for performing the step (c) once is 30 second or shorter.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of a substrate processing method and a substrate processing apparatus will be described in detail based on the accompanying drawings. The substrate processing method and the substrate processing apparatus of the present disclosure are not limited by the embodiments.

As semiconductor devices have been recently miniaturized, the aspect ratio of a hole formed in a substrate used for the semiconductor devices tends to increase. When a hole with a relatively high aspect ratio is formed in a substrate by a plasma etching, the etching time increases, and as a result, the charge amount of the substrate may increase. When the charge amount of the substrate increases, a discharge (arcing) may occur at a portion of the substrate having a structure in which relatively small gaps exist. When the arcing occurs, the substrate may be damaged, or materials scattered by the arcing may become particles and adhere to the other regions of the substrate, which may cause defects.

Thus, the present disclosure provides a technique capable of suppressing the occurrence of arcing during an etching process.

[Configuration of Etching Apparatus 1]

Figure 1:
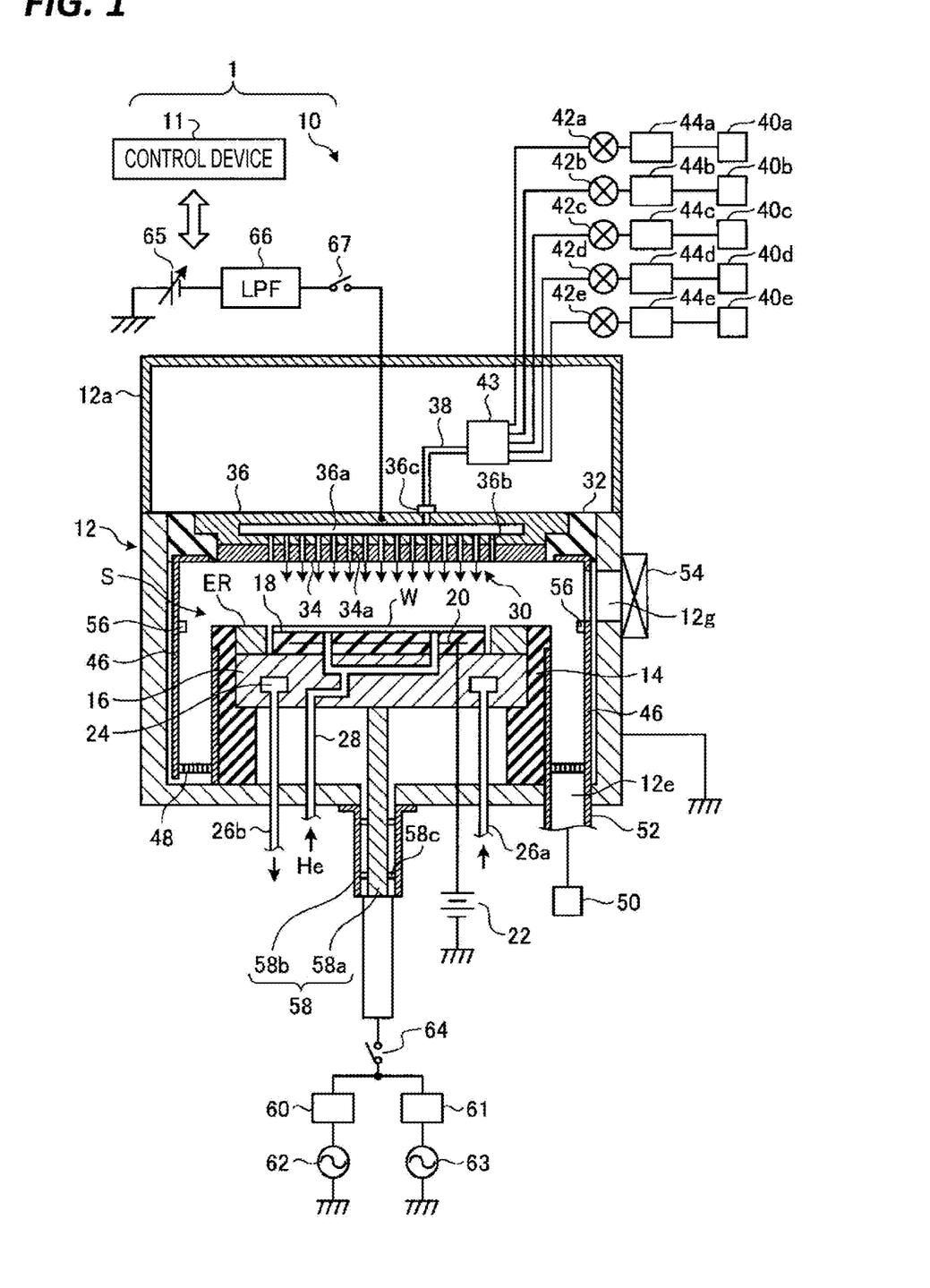
FIG. 1 is a schematic cross-sectional view illustrating an example of an etching apparatus according to an embodiment of the present disclosure.

FIG. 1 is a schematic cross-sectional view illustrating an example of an etching apparatus 1 according to an embodiment of the present disclosure. The etching apparatus 1 includes an apparatus body 10 and a control device 11 that controls the apparatus body 10. The apparatus body 10 is a capacitively coupled parallel plate plasma etching apparatus, and includes a substantially cylindrical chamber 12 with the surface formed of, for example, anodized aluminum. The chamber 12 is grounded for security. The etching apparatus 1 is an example of the substrate processing apparatus.

The chamber 12 includes an electrostatic chuck 18 and an upper electrode 30. A substantially cylindrical support 14 formed of an insulating material is disposed at the bottom of the chamber 12 inside the chamber 12. The support 14 supports a base 16 formed of a metal such as aluminum. The base 16 is provided inside the chamber 12. In the present embodiment, the base 16 also functions as a lower electrode.

The electrostatic chuck 18 is provided on the upper surface of the base 16. The electrostatic chuck 18 is an example of a substrate support. The electrostatic chuck 18 has a structure in which an electrode 20 is disposed as a conductive film between a pair of insulating films or insulating sheets. A DC power supply 22 is electrically connected to the electrode 20. The electrostatic chuck 18 adsorbs and holds a substrate W on the upper surface thereof by an electrostatic force such as a Coulomb force generated by the DC voltage supplied from the DC power supply 22.

An edge ring ER is disposed around the electrostatic chuck 18 on the upper surface of the base 16. The edge ring ER is provided to improve the uniformity of etching. The edge ring ER is formed of a material appropriately selected according to a material of a film to be etched. In the present embodiment, the edge ring ER is formed of, for example, silicon or quartz.

A flow path 24 is formed inside the base 16. A refrigerant controlled to a predetermined temperature is supplied to the flow path 24 from a chiller unit provided outside through pipes 26a and 26b, and circulates in the flow path 24. The refrigerant is, for example, cooling water. By controlling the temperature of the refrigerant that circulates in the flow path 24, the temperature of the substrate W placed on the electrostatic chuck 18 is controlled.

A pipe 28 is provided in the electrostatic chuck 18 and the base 16. The pipe 28 is connected to a heat transfer gas source that supplies, for example, He gas. The heat transfer gas supplied from the heat transfer gas source is supplied between the electrostatic chuck 18 and the substrate W via the pipe 28.

The upper electrode 30 is disposed above the base 16 that functions as a lower electrode, and the base 16 and the upper electrode 30 are substantially parallel to each other. The upper electrode 30 faces the electrostatic chuck 18. A processing space S in which plasma is generated is defined between the upper electrode 30 and the base 16.

The upper electrode 30 is supported in the upper portion of the chamber 12 via an insulating shielding member 32. The upper electrode 30 includes an electrode plate 34 and an electrode support 36. The lower surface of the electrode plate 34 faces the processing space S. A plurality of gas injection holes 34a is formed in the electrode plate 34 to penetrate the electrode plate 34 in the thickness direction thereof. The gas injection holes 34a are an example of gas supply ports for supplying a processing gas into the chamber 12.

The electrode support 36 is formed of a conductive material such as aluminum, and detachably supports the electrode plate 34. The electrode support 36 may have a water-cooled structure. A diffusion chamber 36a is provided inside the electrode support 36. The diffusion chamber 36a communicates with the gas injection holes 34a via a plurality of gas flow holes 36b. Further, a gas inlet 36c is provided in the electrode support 36 to introduce a processing gas into the diffusion chamber 36a. A pipe 38 is connected to the gas inlet 36c.

A variable DC power supply 65 is connected to the electrode support 36 via a switch 67 and a low pass filter (LPF) 66. The variable DC power supply 65 supplies a negative DC voltage to the electrode support 36. The control device 11 controls the magnitude of the absolute value of the negative DC voltage supplied from the variable DC power supply 65 to the electrode support 36. The LPF 66 removes the radio-frequency component of the negative DC voltage supplied to the electrode support 36. The switch 67 switches the supply of the negative DC voltage from the variable DC power supply 65 to the electrode support 36 and the cut-off of the supply. The switch 67 is controlled by the control device 11. The variable DC power supply 65 is an example of a voltage supply.

Gas sources 40a to 40e are connected to the pipe 38 via a splitter 43, valves 42a to 42e, and flow rate controllers 44a to 44e. The flow rate controllers 44a to 44e are each, for example, a mass flow controller (MFC) or a flow control system (FCS). The gas sources 40a and 40b supply, for example, a gas that contains carbon and fluorine. In the present embodiment, the gas source 40a supplies, for example, $C_4F_8$ gas, and the gas source 40b supplies, for example, $C_4F_6$ gas. The gas source 40c supplies, for example, an oxygen-containing gas. In the present embodiment, the oxygen-containing gas is, for example, $O_2$ gas. The oxygen-containing gas may be, for example, CO gas. The gas source 40d supplies, for example, a rare gas. In the present embodiment, the rare gas is, for example, Ar gas. The gas source 40e supplies a nitrogen-containing gas. In the present embodiment, the nitrogen-containing gas is, for example, $N_2$ gas.

The gas supplied from the gas sources 40a to 40e is supplied into the diffusion chamber 36a through the flow rate controllers 44a to 44e, the valves 42a to 42e, the splitter 43, and the pipe 38. The gas supplied into the diffusion chamber 36a diffuses inside the diffusion chamber 36a, and is supplied in a shower form into the processing space S through the gas flow holes 36b and the gas injection holes 34a.

A conductor 12a is provided on the upper portion of the chamber 12, to extend upward above the height position of the upper electrode 30 from the side wall of the chamber 12. The conductor 12a is grounded via the chamber 12.

Further, in the apparatus body 10, a deposit shield 46 is detachably provided along the inner wall of the chamber 12. The deposit shield 46 is also provided on the outer periphery of the support 14. The deposit shield 46 prevents by-products (so-called deposits) of an etching from adhering to the chamber 12. The deposit shield 46 is formed of, for example, aluminum, and the surface thereof is coated with ceramics such as $Y_2O_3$.

A baffle plate 48 is provided close to the bottom of the chamber 12 between the support 14 and the inner wall of the chamber 12. The baffle plate 48 is formed of, for example, aluminum, and the surface thereof is coated with ceramics such as $Y_2O_3$. An exhaust port 12e is provided below the baffle plate 48 in the chamber 12. An exhaust device 50 is connected to the exhaust port 12e via an exhaust pipe 52. The exhaust device 50 includes a vacuum pump such as a turbo molecular pump, and is able to reduce the pressure inside the chamber 12 to a predetermined degree of vacuum. The exhaust device 50 maintains the inside of the chamber 12 at a vacuum degree of, for example, 15 mTorr to 40 mTorr. Further, an opening 12g is formed in the side wall of the chamber 12 to perform carry in/out of the substrate W, and may be opened and closed by a gate valve 54.

A conductive member 56 is provided on the inner wall of the chamber 12 to be grounded in a DC manner. The conductive member 56 is provided at substantially the same height position as that of the substrate W in the height direction. The conductive member 56 prevents an abnormal discharge. Further, the conductive member 56 may be provided within a region where plasma is generated, and the installation position of the conductive member 56 is not limited to the position illustrated in FIG. 1. For example, the conductive member 56 may be provided near the base 16, for example, around the base 16. Further, the conductive member 56 may be provided in a ring shape outside and near the upper electrode 30.

A power feeding rod 58 is connected to the base 16 that makes up the lower electrode, to supply a radio frequency (RF) signal to the base 16. The power feeding rod 58 has a coaxial double-tube structure, and includes a rod-shaped conductive member 58a and a cylindrical conductive member 58b. The rod-shaped conductive member 58a extends substantially vertically from the outside of the chamber 12 to the inside of the chamber 12 through the bottom of the chamber 12. The upper end of the rod-shaped conductive member 58a is connected to the base 16. The cylindrical conductive member 58b is provided coaxially with the rod-shaped conductive member 58a, to surround the rod-shaped conductive member 58a. The cylindrical conductive member 58b is supported by the bottom of the chamber 12. A substantially annular insulating member 58c is disposed between the rod-shaped conductive member 58a and the cylindrical conductive member 58b. The insulating member 58c electrically insulates the rod-shaped conductive member 58a and the cylindrical conductive member 58b.

Matching devices 60 and 61 are connected to the rod-shaped conductive member 58a and the cylindrical conductive member 58b via a switch 64. A first RF power supply 62 is connected to the matching device 60, and a second RF power supply 63 is connected to the matching device 61. The first RF power supply 62 and the second RF power supply 63 are an example of an RF signal supply.

The first RF power supply 62 is a power supply that generates a first RF signal for generating plasma, and generates an RF signal of a frequency of 27 MHz to 100 MHz, for example, a frequency of 40 MHz. The power of the first RF signal may be, for example, 100 W to 2,000 W.

The second RF power supply 63 supplies a radio-frequency bias to the base 16 so as to generate a second RF signal for drawing ions into the substrate W. The frequency of the second RF signal falls within the range of 400 kHz to 13.56 MHz, and is, for example, 3 MHz. The power of the second RF signal is, for example, 100 W to 5,000 W.

The switch 64 switches the supply of the first RF signal and the second RF signal to the rod-shaped conductive member 58a and the cylindrical conductive member 58b, and the cut-off of the supply. As a result, the first RF signal and the second RF signal are supplied in a pulse form to the base 16. The switch 64 is controlled by the control device 11. Hereinafter, the first RF signal and the second RF signal will be referred to as the RF signal when they are collectively referred to without being discriminated from each other.

The control device 11 includes a memory, a processor, and an input/output interface. The memory stores data such as recipes, or programs. The memory is, for example, a RAM (random access memory), a ROM (read only memory), an HDD (hard disk drive) or an SSD (solid state drive). The processor executes the programs read from the memory, so as to control each unit of the apparatus body 10 via the input/output interface based on the data such as recipes stored in the memory. The processor is, for example, a CPU (central processing unit) or a DSP (digital signal processor).

When the plasma etching is performed by the etching apparatus 1, the gate valve 54 is opened, and the substrate W is placed on the electrostatic chuck 18 by a transfer robot (not illustrated). Then, the gas in the chamber 12 is exhausted by the exhaust device 50, and the gases from the gas sources 40a to 40d are each supplied into the chamber 12 at a predetermined flow rate so that the pressure in the chamber 12 is adjusted to a predetermined pressure.

Then, the first RF signal from the first RF power supply 62 and the second RF signal from the second RF power supply 63 are supplied to the base 16, and the negative DC voltage from the variable DC power supply 65 is supplied to the upper electrode 30. As a result, an RF electric field is formed between the upper electrode 30 and the base 16, and plasma is generated from the gas supplied into the processing space S. Then, the substrate W is etched by ions, radicals or the like contained in the plasma generated in the processing space S.

[Structure of Substrate W]

Figure 2:
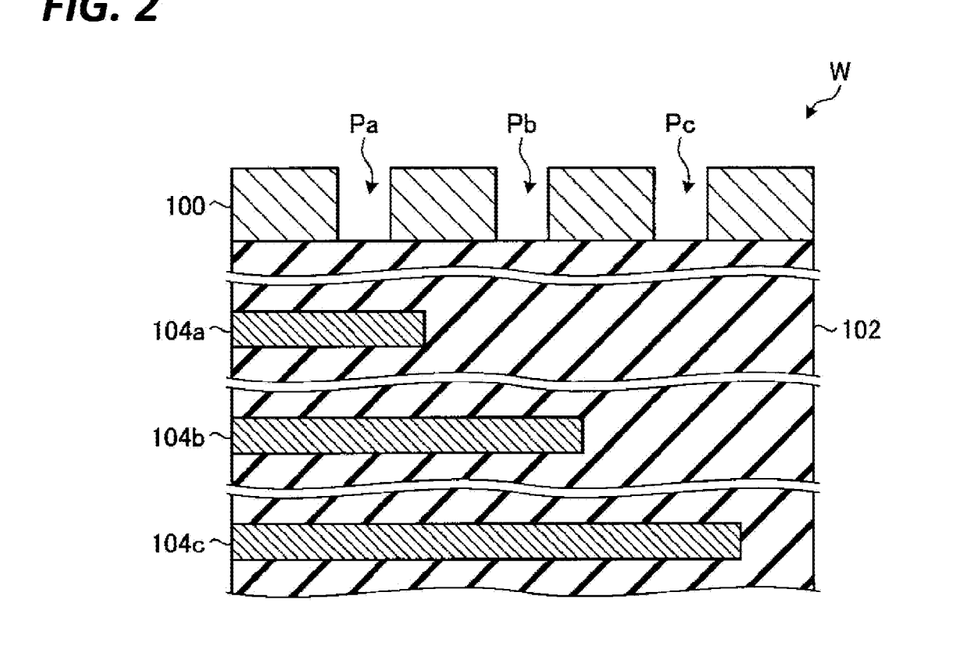
FIG. 2 is a view illustrating an example of the cross section of a substrate before an etching.

Next, the structure of the substrate W to be etched by the etching apparatus 1 described with reference to FIG. 1 will be described. In the present embodiment, the substrate W is used for forming, for example, the structure of a NAND type flash memory with a multilayer film having a three-dimensional structure. FIG. 2 is a view illustrating an example of the cross section of the substrate W before the etching is performed.

A plurality of conductive films 104a to 104c is formed in an insulating film 102, having different lengths in the direction that intersects the thickness direction of the insulating film 102. In the present embodiment, the insulating film 102 is, for example, an oxide film (silicon oxide film), and each of the conductive films 104a to 104c is, for example, silicon or tungsten. A mask film 100 is provided on the insulating film 102, and patterns Pa to Pc are formed in the mask film 100 to correspond to predetermined holes. In the example of FIG. 2, the conductive film 104a is disposed below the pattern Pa, the conductive film 104b is disposed below the pattern Pb, and the conductive film 104c is disposed below the pattern Pc, in the thickness direction of the insulating film 102. Each of the conductive films 104a to 104c also functions as an etching stop layer when the insulating film 102 is etched. Hereinafter, the conductive films 104a to 104c will be referred to as the conductive film 104 when they are collectively referred to without being discriminated from each other.

Figure 3:
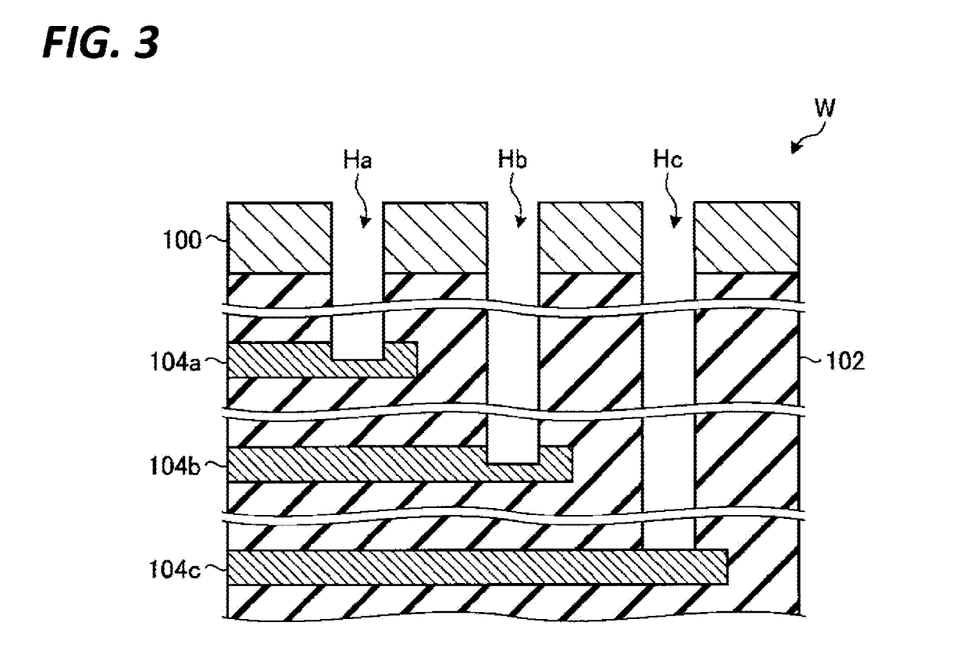
FIG. 3 is a view illustrating an example of the cross section of the substrate before the etching.

When the insulating film 102 is etched using the mask film 100 as a mask, holes Ha to Hc are formed in the insulating film 102 as illustrated in, for example, FIG. 3. FIG. 3 is a view illustrating an example of the cross section of the substrate W after the etching is performed. When a metal is embedded in the holes Ha to Hc, wirings are formed to be individually connected to the conductive films 104a to 104c, respectively.

[Behavior of Electrons in Plasma]

Figure 4:
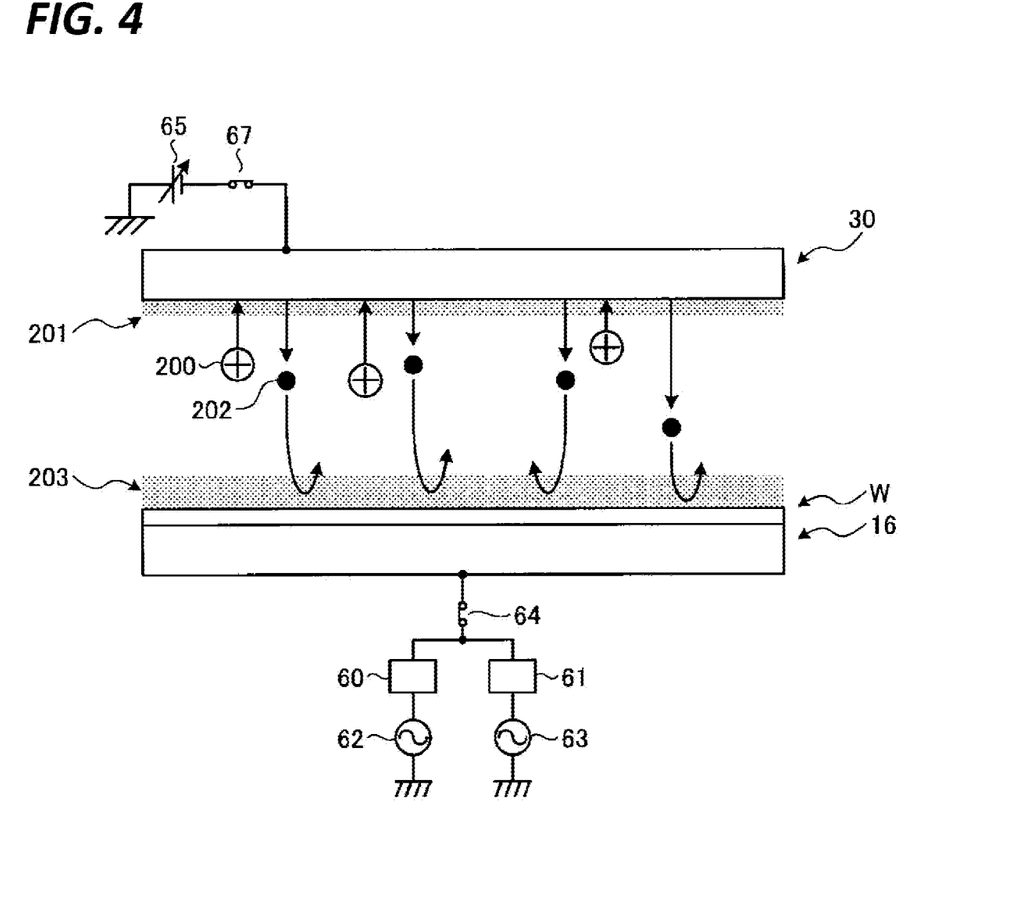
FIG. 4 is a schematic view illustrating an example of a movement of electrons inside a chamber during a plasma etching.

FIG. 4 is a schematic view illustrating an example of the movement of electrons in the chamber 12 during the plasma etching. When the first RF signal from the first RF power supply 62 and the second RF signal from the second RF power supply 63 are supplied to the base 16, plasma is generated from the gas supplied into the chamber 12. The plasma contains ions 200, radicals or the like. When plasma is generated in the chamber 12, a sheath 203 is generated near the base 16. By the sheath 203, the ions 200 contained in the plasma are drawn into the substrate W, and the substrate W is etched.

When the ions 200 are excessively drawn into the substrate W, the substrate W may be damaged. Thus, a negative DC voltage is supplied to the upper electrode 30. As a result, a sheath 201 is generated near the upper electrode 30, and a portion of the ions 200 in the plasma is drawn into the upper electrode 30. As a result, the ions 200 that collide with the substrate W are reduced, so that the damage to the substrate W is reduced. Further, electrons 202 are emitted from the upper electrode 30 by the ions 200 drawn into the upper electrode 30.

Here, when the plasma etching is performed, the substrate W is charged by the ions 200 drawn into the substrate W. While the electrons 202 are emitted from the upper electrode 30 by the ions 200 drawn into the upper electrode 30, the emitted electrons 202 are prevented from reaching the substrate W due to the sheath 203 as illustrated in, for example, FIG. 4. Thus, the charge of the substrate W may not be neutralized by the electrons 202. Accordingly, when the time for the plasma etching increases, an arcing may occur in the substrate W. In experiments, there was a case where when the plasma etching is continued for 30 seconds or longer, an arcing occurs in the substrate W.

Figure 5:
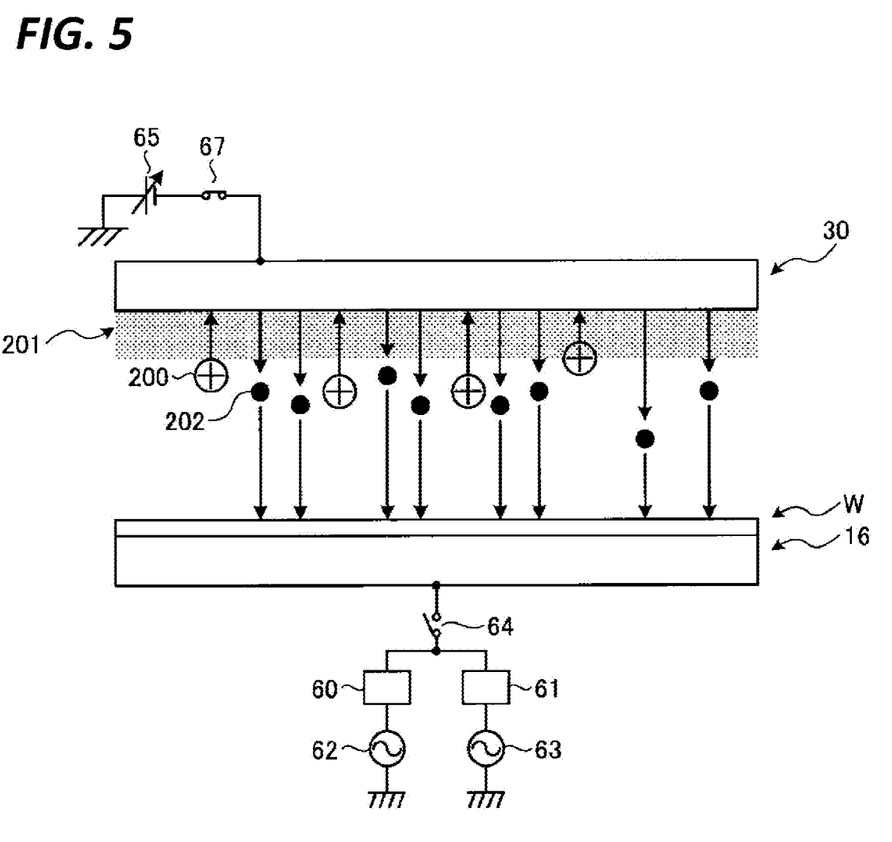
FIG. 5 is a schematic view illustrating an example of the movement of the electrons inside the chamber when a supply of RF signals is stopped.

Here, as illustrated in, for example, FIG. 5, when the supply of the RF signal to the base 16 is cut off, the sheath 203 near the base 16 disappears. Thus, the electrons 202 emitted from the upper electrode 30 by the ions 200 drawn into the upper electrode 30 may easily reach the substrate W. As a result, the charge amount of the substrate W is reduced. FIG. 5 is a schematic view illustrating an example of the movement of the electrons 202 in the chamber 12 when the supply of the RF signal is stopped.

At this time, when the absolute value of the negative DC voltage supplied to the upper electrode 30 is increased, the sheath 201 near the upper electrode 30 becomes relatively thick, and the amount of the ions 200 drawn into the upper electrode 30 increases. As a result, the amount of the electrons 202 emitted from the upper electrode 30 by the ions 200 drawn into the upper electrode 30 also increases. As a result, the amount of the electrons 202 that reach the substrate W increases, and the charge amount of the substrate W decreases at an early stage.

Figure 6A:
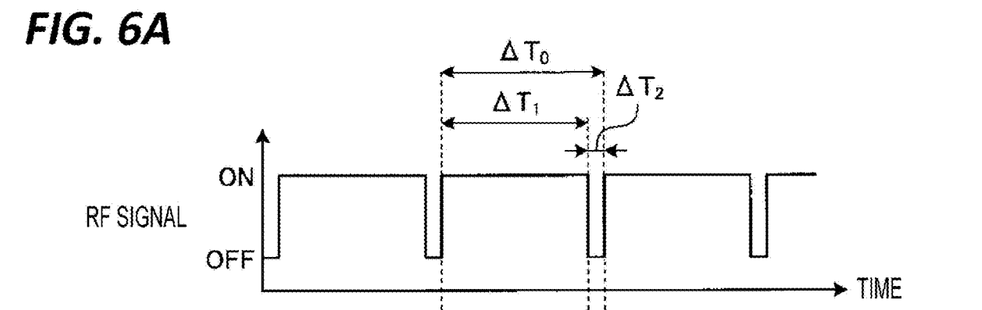
FIGS. 6A and 6B are views illustrating an example of a control of the RF signals and a DC voltage.
Figure 6B:
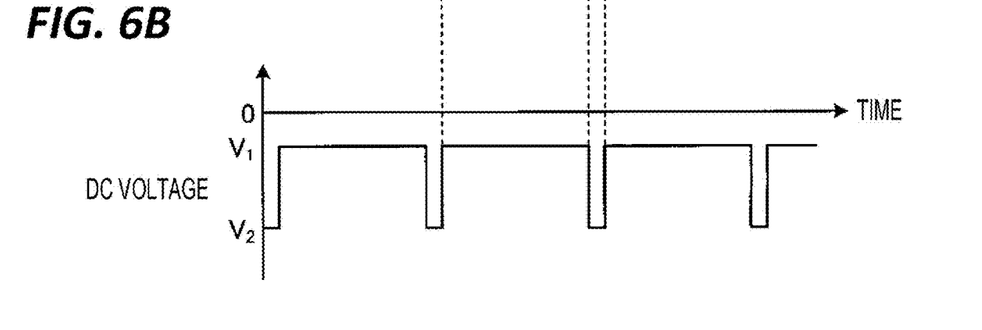

Thus, it may be conceivable to control the RF signal and the negative DC voltage as illustrated in, for example, FIGS. 6A and 6B. FIGS. 6A and 6B are views illustrating an example of the control of the RF signal and the DC voltage.

The RF signal is supplied (ON) and cut off (OFF) at predetermined time intervals as illustrated in, for example, FIG. 6A. As a result, the etching proceeds in a first time period $\Delta T_1$ during which the RF signal is supplied, and the charge of the substrate W is neutralized in a second time period $\Delta T_2$ during which the supply of the RF signal is cut off.

In the present embodiment, the length of one time period $\Delta T_0$ that includes the supply of the RF signal and the cut-off of the supply may be, for example, 50 milliseconds or shorter. That is, the frequency for supplying the RF signal and cutting off the supply may be, for example, 20 Hz or higher.

In the present embodiment, the duty ratio of the RF signal may be 90% or more. The duty ratio of the RF signal is the ratio of the first time period $\Delta T_1$ during which the RF signal is supplied to the one time period $\Delta T_0$ that includes the supply of the RF signal and the cut-off of the supply.

As illustrated in, for example, FIG. 6B, in the second time period $\Delta T_2$ during which the supply of the RF signal is cut off, a negative DC voltage $V_2$ is supplied which has the absolute value larger than the absolute value of the negative DC voltage $V_1$ supplied in the first time period $\Delta T_1$ during which the RF signal is supplied ($|V_1|<|V_2|$). Specifically, the negative DC voltage $V_2$ in the second time period $\Delta T_2$ is, for example, −1,000 V, and the negative DC voltage $V_1$ in the first time period $\Delta T_1$ is, for example, −200 V. As a result, a sufficient amount of electrons may be supplied to the substrate W in the second time period $\Delta T_2$, so that the charge amount of the substrate W may be rapidly reduced.

Here, when the RF signal and the negative DC voltage are controlled as illustrated in FIGS. 6A and 6B, the arcing of the substrate W may be reduced. However, in the control of the RF signal illustrated in FIG. 6A, polymer is not formed on the conductive film 104 in the second time period $\Delta T_2$ during which the supply of the RF signal is cut off. Thus, the selectivity of the conductive film 104 with respect to the insulating film 102 is reduced, and as a result, the conductive film 104 may be overly etched. Thus, in the control of the RF signal illustrated in FIG. 6A, the function of the etching stop layer in the conductive film 104 is deteriorated, and holes may be formed through the conductive film 104. As a result, it may become difficult to form holes in the substrate W as designed.

Figure 7A:
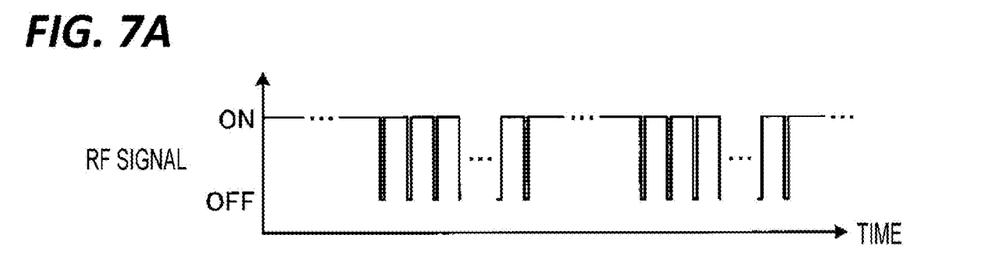
FIGS. 7A and 7B are views illustrating an example of timings for a first etching process and a second etching process.
Figure 7B:
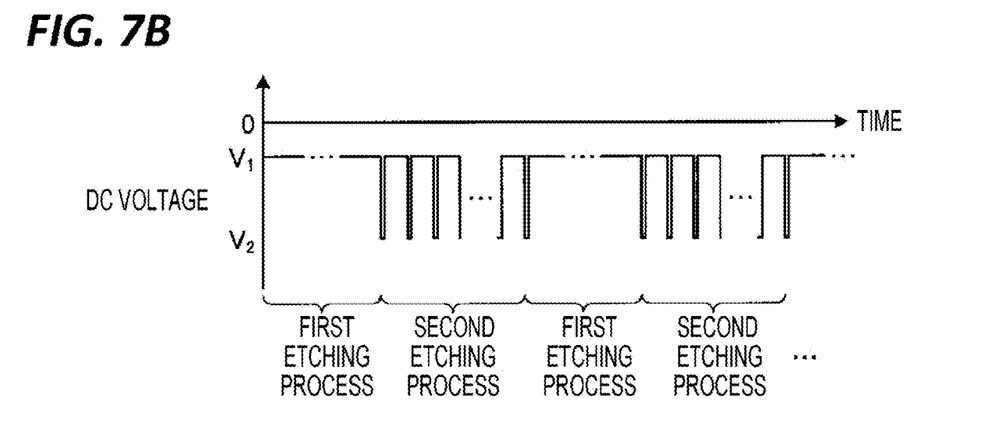

In the present embodiment, as illustrated in, for example, FIGS. 7A and 7B, a first etching step and a second etching step are repeatedly performed in an alternate manner. In the first etching step, the etching is performed in a state where the RF signal and the negative DC voltage are continuously supplied. In the second etching step, the etching is performed under the control of the RF signal and the negative DC voltage illustrated in FIGS. 6A and 6B. As a result, the etching amount of the conductive film 104 may be reduced while suppressing the arcing of the substrate W.

[$V_{pp}$ of RF Signal]

The peak-to-peak magnitude of the voltage of the RF signal ($V_{pp}$) changes according to the state of the inside of the chamber 12. For example, when the time for the plasma etching increases, the impedance between the chamber 12 and plasma changes due to the influence of deposits that adhere to the inner wall of the chamber 12 or the wear of the components inside the chamber 12. As a result, the control amounts of the matching devices 60 and 61 may change, and the magnitude of $V_{pp}$ of the RF signal may change. When the magnitude of $V_{pp}$ of the RF signal changes, the amount of polymer formed on the conductive film 104 changes.

For example, when the $V_{pp}$ of the RF signal decreases, the amount of polymer formed on the conductive film 104 decreases. When the amount of polymer formed on the conductive film 104 decreases, the selectivity of the conductive film 104 with respect to the insulating film 102 decreases. As a result, the conductive film 104 may be overly etched.

In order to avoid this problem, in the present embodiment, the $V_{pp}$ of the RF signal is controlled to a magnitude within a predetermined range, in the first etching step and the second etching step. As a result, a sufficient amount of polymer may be formed on the conductive film 104, and the selectivity of the conductive film 104 with respect to the insulating film 102 may be improved, so that the etching amount of the conductive film 104 may be reduced.

Figure 8:
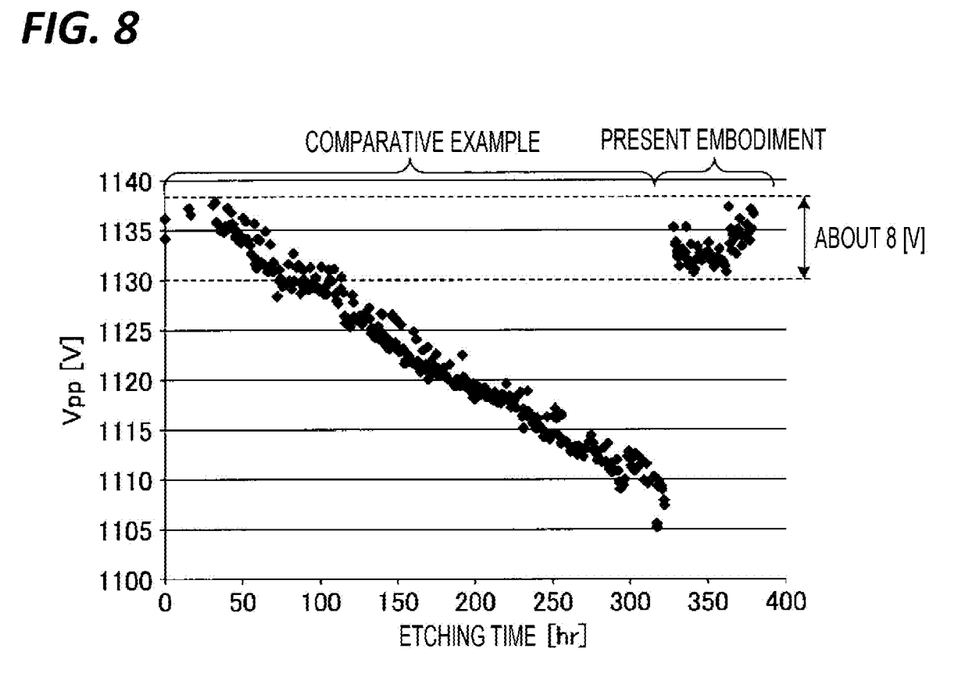
FIG. 8 is a view illustrating an example of a change of the magnitude of $V_{pp}$ with respect to an etching time.

FIG. 8 is a view illustrating an example of the change in magnitude of $V_{pp}$ with respect to the etching time. When the adjustment of the $V_{pp}$ of the RF signal is not performed, the $V_{pp}$ of the RF signal decreases as the etching time elapses, as illustrated in the comparative example of FIG. 8.

Meanwhile, in the present embodiment, the $V_{pp}$ of the RF signal is controlled to a magnitude within a predetermined range. As a result, as illustrated in, for example, FIG. 8, the change in magnitude of the $V_{pp}$ of the RF signal is suppressed within about 8 V even when the etching time exceeds 350 hr.

Figure 9:
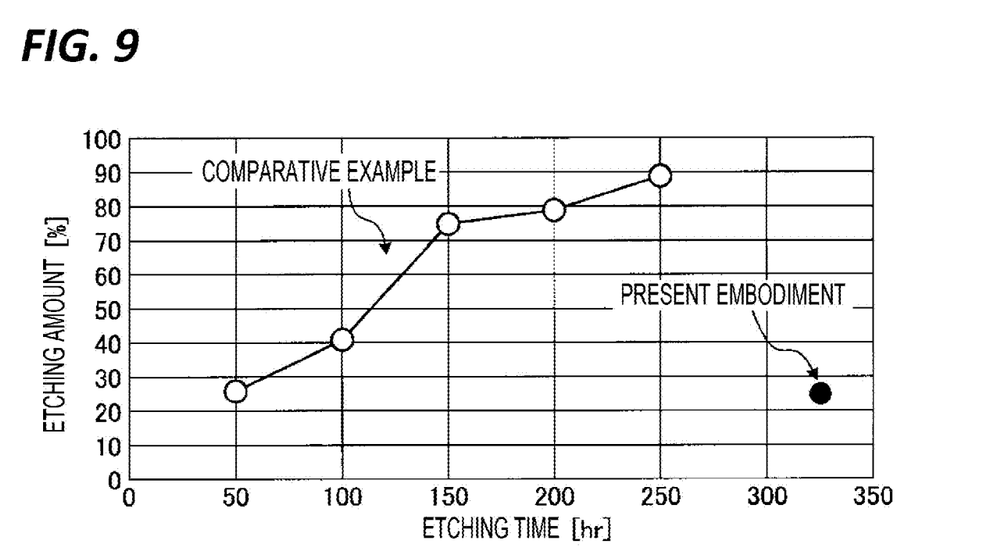
FIG. 9 is a view illustrating an example of an etching amount of a conductive film with respect to an etching time.

FIG. 9 is a view illustrating an example of the etching amount of the conductive film 104 with respect to the etching time. When the adjustment of the $V_{pp}$ of the RF signal is not performed, the etching amount of the conductive film 104 increases as the etching time elapses, as illustrated in the comparative example of FIG. 9. A state where the etching amount of the conductive film 104 reaches 100% indicates a state where a hole penetrates the conductive film 104.

Meanwhile, in the present embodiment, the $V_{pp}$ of the RF signal is controlled to a magnitude within a predetermined range, so that the increase in etching amount of the conductive film 104 is suppressed, as illustrated in, for example, FIG. 9. In the example of FIG. 9, the etching amount of the conductive film 104 is suppressed to be less than 30%, even when the etching time exceeds 300 hr. In this way, in the present embodiment, the $V_{pp}$ of the RF signal is controlled to a magnitude within a predetermined range, so that a sufficient amount of polymer may be formed on the conductive film 104. Thus, the selectivity of the conductive film 104 with respect to the insulating film 102 may be improved, so that the etching amount of the conductive film 104 may be reduced.

[Removal of Polymer]

Figure 10:
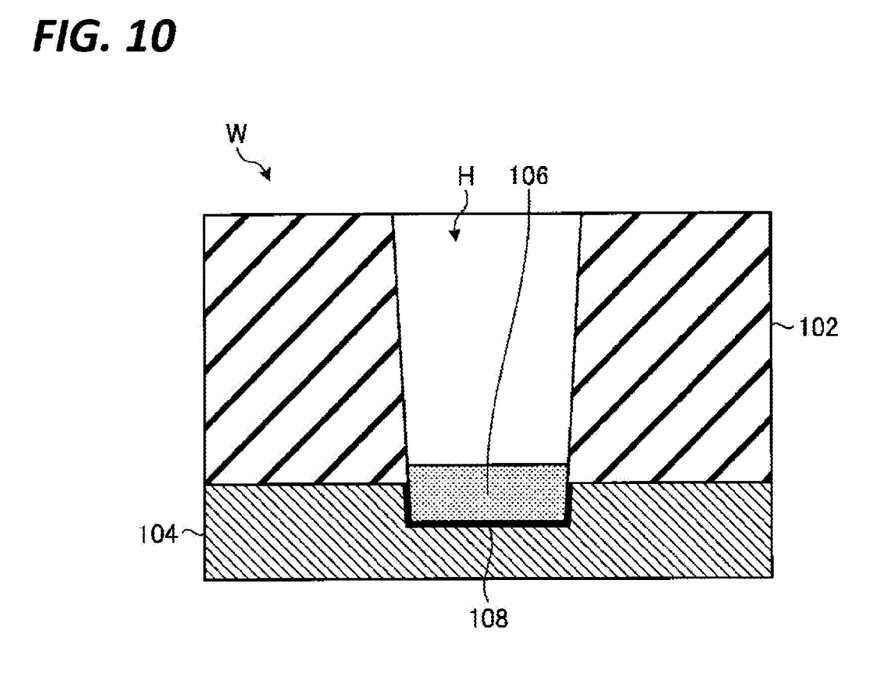
FIG. 10 is a schematic view illustrating an example of a state of a hole immediately after an etching is completed.

FIG. 10 is a schematic view illustrating an example of the state of a hole H immediately after the etching is completed. Immediately after the etching is completed, polymer 106 is formed at the bottom of the hole H as illustrated in, for example, FIG. 10. An oxide film 108 is formed between the polymer 106 and the conductive film 104 as a result of a reaction with the oxygen-containing gas.

Figure 11:
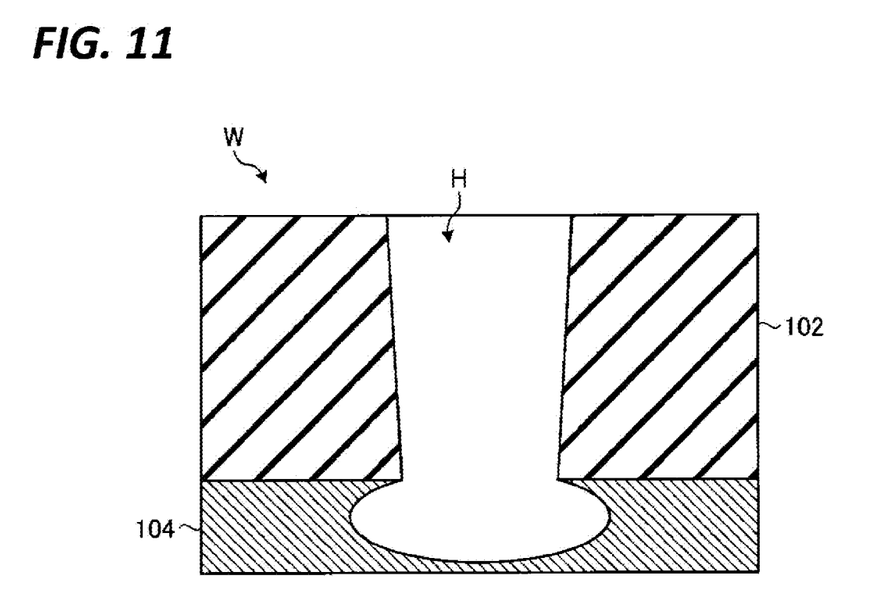
FIG. 11 is a view illustrating an example of a state where the conductive film is eroded.

Here, when the substrate W in the state illustrated in FIG. 10 is exposed to the atmosphere, the moisture contained in the atmosphere reacts with the polymer 106 so that hydrofluoric acid is produced at the bottom of the hole H. As a result, the bottom of the hole H is further eroded as illustrated in, for example, FIG. 11. FIG. 11 is a view illustrating an example of a state where the conductive film 104 is eroded. As a result, the conductive film 104 is etched more excessively than a design value.

Figure 12:
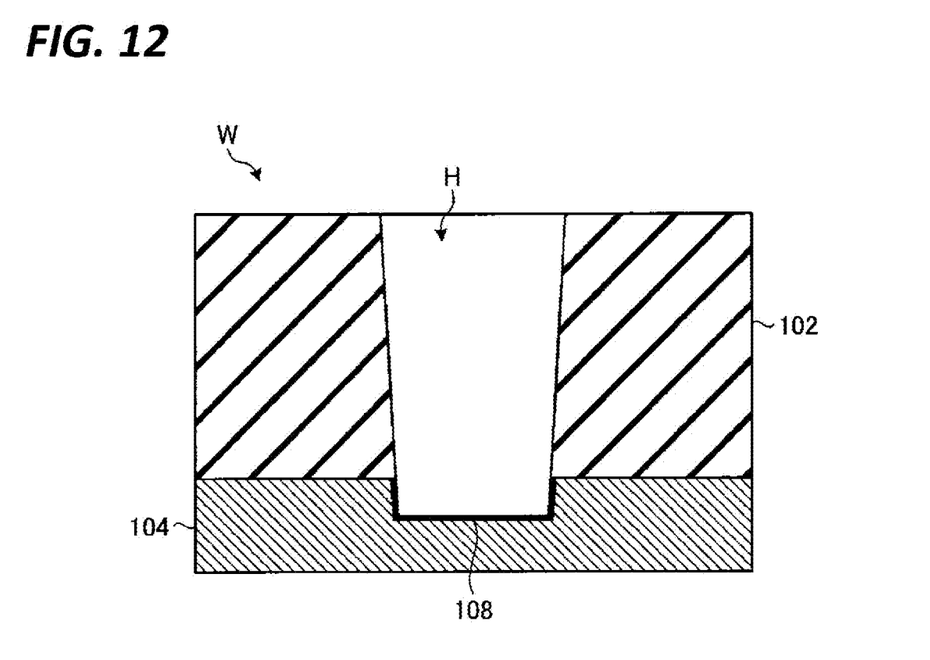
FIG. 12 is a view illustrating an example of a state of a hole formed according to the embodiment.

Thus, in the present embodiment, the substrate W in the state of FIG. 10 where the etching of the substrate W is completed is exposed to plasma generated from the nitrogen-containing gas. As a result, the polymer 106 that remains at the bottom of the hole H is removed as illustrated in, for example, FIG. 12. FIG. 12 is a view illustrating an example of the state of the hole H formed by the present embodiment. Then, the oxide film 108 is removed by an ashing, and a processing of the next step is performed. As a result, the hole H having a shape close to the design value may be formed in the substrate W.

[Etching Method]

Figure 13:
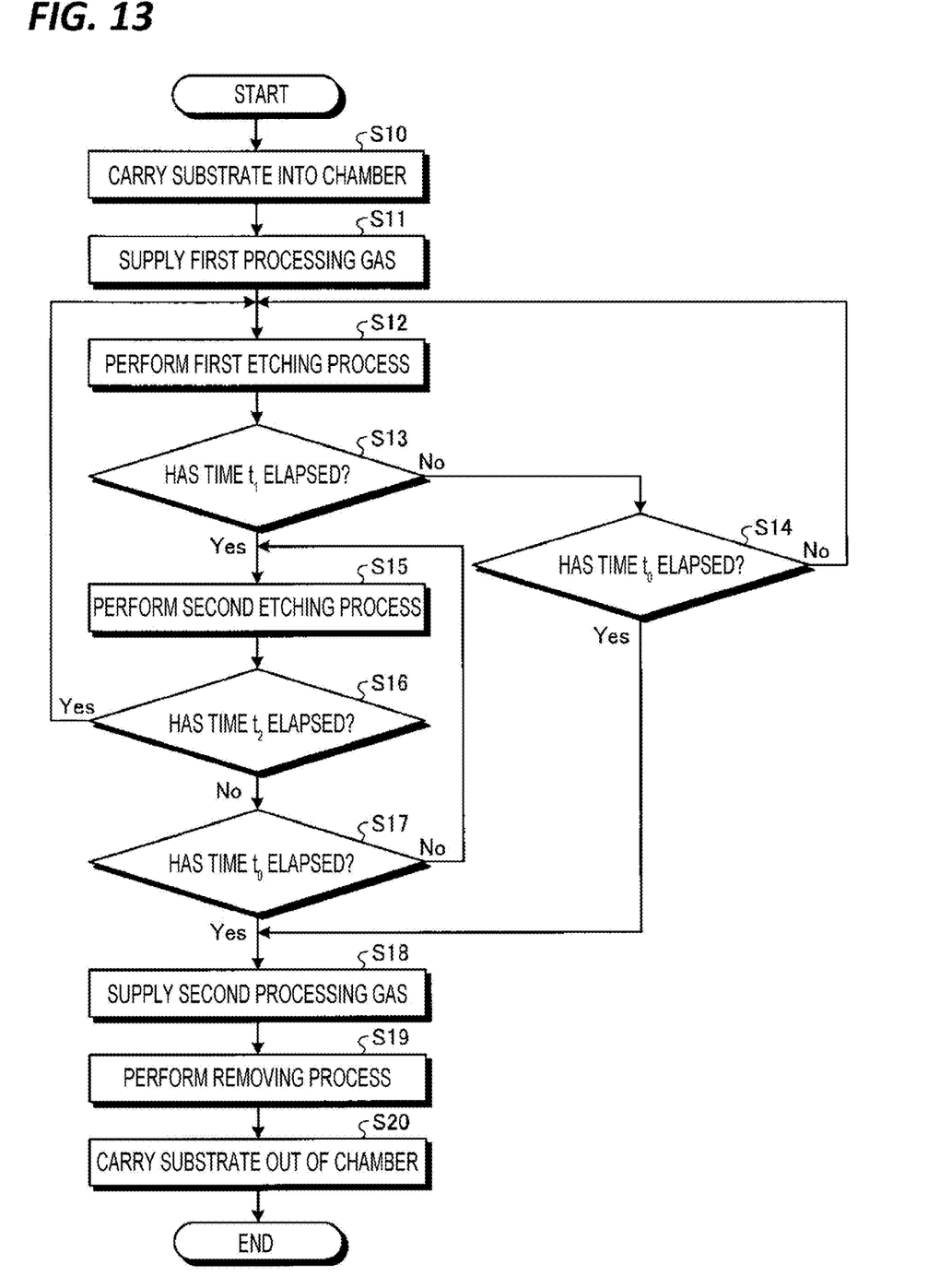
FIG. 13 is a flowchart illustrating an example of an etching method.

FIG. 13 is a flowchart illustrating an example of an etching method. The etching method illustrated in FIG. 13 is implemented in the manner that, for example, the processor of the control device 11 reads and executes the programs stored in the memory of the control device 11, and controls each unit of the apparatus body 10 via the input/output interface of the control device 11. The etching method illustrated in FIG. 13 is an example of the substrate processing method.

First, the substrate W is carried into the chamber 12 (S10). In step S10, the gate valve 54 is opened, and the substrate W is carried into the chamber 12 by a transfer robot (not illustrated) and placed on the electrostatic chuck 18. Then, the gate valve 54 is closed. Step S10 is an example of step (a).

Next, a processing gas is supplied into the chamber 12 (S11). In step S11, the gas in the chamber 12 is exhausted by the exhaust device 50. Then, the $C_4F_8$ gas from the gas source 40a, the $C_4F_6$ gas from the gas source 40b, the $O_2$ gas from the gas source 40c, and the Ar gas from the gas source 40d are each into the chamber 12 at a predetermined flow rate. Then, the pressure in the chamber 12 is adjusted to a predetermined pressure. Hereinafter, the gas that includes the $C_4F_8$ gas, the $C_4F_6$ gas, the $O_2$ gas, and the Ar gas will be referred to as a first processing gas. Step S11 is an example of step (b).

Next, the first etching step is performed (S12). In the first etching step, the RF signal is continuously supplied into the chamber 12, while the negative DC voltage is continuously supplied to the upper electrode 30. As a result, plasma is generated from the first processing gas supplied into the chamber 12, and the substrate W placed on the electrostatic chuck 18 is etched by the plasma generated from the first processing gas. Step S12 is an example of step (c).

The main processing conditions for the first etching step are described below.

Pressure: 10 mTorr to 30 m Torr
Power of first RF signal: 1,000 W to 2,000 W
Power of second RF signal: 3,000 W to 6,000 W
Negative DC voltage: −300 V to −100V
$C_4F_8$ gas: 20 sccm to 40 sccm
$C_4F_6$ gas: 5 sccm to 20 sccm
$O_2$ gas: 10 sccm to 30 sccm
Ar gas: 300 sccm to 600 sccm Next, it is determined whether a predetermined time $t_1$ has elapsed since the first etching step is started (S13). In the present embodiment, the time $t_1$ is, for example, 30 seconds. When it is determined that the time $t_1$ has not elapsed (S13: No), it is determined whether a predetermined time to has elapsed since the etching is started (S14). When it is determined that the time to has not elapsed (S14: No), the processing of step S12 is performed again. Meanwhile, when it is determined that the time to has elapsed (S14: Yes), the processing of step S18 to be described later is performed. The time to is the total etching time that is required to form the deepest hole.

Meanwhile, when it is determined that the time $t_1$ has elapsed (S13: Yes), the second etching step is performed (S15). In the second etching step, the supply of the RF signal and the cut-off of the supply are repeated at predetermined time intervals, while continuously supplying the negative DC voltage to the upper electrode 30, so as to etch the substrate W placed on the electrostatic chuck 18. Further, in the second etching step, a negative DC voltage $V_1$ which has the relatively small absolute value is supplied to the upper electrode 30 in the first time period $\Delta T_1$ during which the RF signal is supplied, and a negative DC voltage $V_2$ which has the relatively large absolute value is supplied to the upper electrode 30 in the second time period $\Delta T_2$ during which the supply of the RF signal is cut off. In the first time period $\Delta T_1$, the negative DC voltage $V_1$ of, for example, −200 V is supplied to the upper electrode 30, and in the second time period $\Delta T_2$, the negative DC voltage $V_2$ of, for example, −1,000 V is supplied to the upper electrode 30. The main processing conditions for the second etching step are the same as those for the first etching step, except that the supply of the RF signal is intermitted, and the absolute value of the negative DC voltage is switched. Step S15 is an example of step (d).

Next, it is determined whether a predetermined time $t_2$ has elapsed since the second etching step is started (S16). In the present embodiment, the time $t_2$ is, for example, 60 seconds. When it is determined that the time $t_2$ has not elapsed (S16: No), it is determined whether the predetermined time $t_0$ has elapsed since the etching is started (S17). When it determined that the time $t_0$ has not elapsed (S17: No), the processing of step S14 is performed again.

Meanwhile, when it is determined that the time to has elapsed (S17: Yes), the second processing gas is supplied into the chamber 12 (S18). In step S18, the gas in the chamber 12 is exhausted by the exhaust device 50. Then, the Ar gas from the gas source 40d and the $N_2$ gas from the gas source 40e are each supplied into the chamber 12 at a predetermined flow rate, such that the pressure in the chamber 12 is adjusted to a predetermined pressure. Hereinafter, the gas that includes the Ar gas and the $N_2$ gas will be referred to as a second processing gas. Step S18 is an example of step (e).

Next, a removing process is performed (S19). In the removing process, the RF signal is continuously supplied into the chamber 12. As a result, plasma is generated from the second processing gas supplied into the chamber 12, and polymer in the hole is removed by the plasma generated form the second processing gas. Step S19 is an example of step (f).

The main processing conditions for the removing process are described below.

Pressure: 10 mTorr to 30 mTorr
Power of first RF signal: 200 W to 2,000 W
Power of second RF signal: 100 W to 1,000 W
$N_2$ gas: 50 sccm to 200 sccm
Ar gas: 100 sccm to 500 sccm
Processing time: 5 seconds to 20 seconds Then, the gas in the chamber 12 is exhausted by the exhaust device 50, the gate valve 54 is opened, and the substrate W is carried out from the chamber 12 by a transfer robot (not illustrated) (S18). Then, the etching method illustrated in the present flowchart is ended.

The embodiment has been described. As described above, the substrate processing method according to the present embodiment is a substrate processing method performed in the chamber 12. The chamber 12 includes the electrostatic chuck 18 for placing the substrate W thereon, the upper electrode 30 that faces the electrostatic chuck 18, and the gas injection holes 34a that supply a processing gas into the chamber 12. The substrate processing method includes steps (a) to (d). Step (a) provides a substrate to the electrostatic chuck 18. Step (b) supplies the first processing gas into the chamber 12. Step (c) continuously supplies the RF signal while continuously supplying the negative DC voltage to the upper electrode 30, to generate plasma from the first processing gas. Step (d) supplies the pulsed RF signal while continuously supplying the negative DC voltage to the upper electrode 30, to generate plasma from the first processing gas. Steps (c) and (d) are alternately repeated. The time period for performing step (c) once is 30 seconds or shorter. As a result, the occurrence of arcing in the etching process may be suppressed.

Further, in the embodiment described above, the time period for performing step (d) once is 60 seconds or shorter. As a result, an excessive etching may be suppressed.

In step (d) of the embodiment described above, the ratio of the time period during which the RF signal is supplied, to one cycle of the pulsed RF signal is 90% or more. As a result, the etching may be progressed while suppressing the occurrence of arcing, in step (d) as well.

Further, in step (d) of the embodiment described above, the time period of one cycle of the pulsed RF signal is 50 milliseconds or shorter. As a result, the occurrence of arcing may be suppressed in step (d) as well.

Further, in step (d) of the embodiment described above, the absolute value of the negative DC voltage $V_2$ supplied to the upper electrode 30 in the second time period $\Delta T_2$ during which the supply of the RF signal is cut off is larger than the absolute value of the negative DC voltage $V_1$ supplied to the upper electrode 30 in the first time period $\Delta T_1$ during which the RF signal is supplied. As a result, the substrate W may be efficiently discharged in a relatively short time period.

In the embodiment described above, the substrate W is provided on the conductive film 104, the insulating film 102 provided on the conductive film 104, and the pattern PR film on which a predetermined pattern P is formed. The insulating film 102 is, for example, an oxide film (silicon oxide film), and the conductive film 104 is a film of silicon or tungsten. In the etching of the substrate W having this structure, the occurrence of arcing may be suppressed.

In the embodiment described above, the first processing includes a gas that contains carbon and fluorine, an oxygen-containing gas, and a rare gas. The gas that contains carbon and fluorine is $C_4F_8$ gas or $C_4F_6$ gas, the oxygen-containing gas is $O_2$ gas or CO gas, and the rare gas is Ar gas. As a result, plasma is generated from the first processing gas, and the substrate W may be etched by the generated plasma.

The substrate processing method according to the embodiment described above further includes steps (e) and (f). Step (e) is performed after (c) and (d) are repeated, and supplies the second processing gas that includes a nitrogen-containing gas and a rare gas, into the chamber 12. In step (f), the RF signal is supplied into the chamber 12 so that plasma is generated from the second processing gas, and the polymer that remains in the hole H formed in the substrate W as a result of steps (c) and (d) is removed by the generated plasma. The nitrogen-containing gas is $N_2$ gas, and the rare gas is Ar gas. As a result, the hole H having a shape close to the design value may be formed in the substrate W.

In steps (c) and (d) of the embodiment described above, the $V_{pp}$ magnitude of the voltage of the pulsed RF signal is controlled to fall within a predetermined range. As a result, a sufficient amount of polymer may be formed on the conductive film 104, so that the selectivity of the conductive film 104 with respect to the insulating film 102 may be improved, and the etching amount of the conductive film 104 may be reduced.

The etching apparatus 1 according to the embodiment described above includes the chamber 12, the upper electrode 30 provided inside the chamber 12, the electrostatic chuck 18 that faces the upper electrode 30 and places the substrate W thereon, and the first RF power supply 62 and the second RF power supply 63 that supply the RF signal, the variable DC power supply 65 that supplies the negative DC voltage to the upper electrode 30, and the control device 11. The control device 11 executes steps (a) to (d). Step (a) provides the substrate W to the electrostatic chuck 18. Step (b) supplies the first processing gas into the chamber 12. Step (c) continuously supplies the RF signal into the chamber 12 while continuously supplying the negative DC voltage to the upper electrode 30, to generate plasma from the first processing gas. Step (d) supplies the pulsed RF signal while continuously supplying the negative DC voltage to the upper electrode 30, to generate plasma from the first processing gas. Steps (c) and (d) are alternately repeated. The time period for performing step (c) once is 30 seconds or shorter. As a result, the occurrence of arcing in the etching process may be suppressed.

[Miscellaneous]

The present disclosure is not limited to the embodiment described above, and may be modified in various ways within the scope of the gist thereof.

For example, in the embodiment described above, the etching apparatus 1 using capacitively coupled plasma (CCP) as a plasma source has been described. However, the plasma source is not limited thereto. Examples of the plasma source other than the capacitively coupled plasma may include inductively coupled plasma (ICP), microwave excited surface wave plasma (SWP), electron cycloton resonance plasma (ECP), and helicon wave excited plasma (HWP).

According to various aspects and embodiments of the present disclosure, the occurrence of arcing may be suppressed during an etching process.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
    (a) providing a substrate on a substrate support disposed in a chamber;
    (b) supplying a first processing gas into the chamber;
    (c) continuously supplying an RF signal into the chamber while continuously supplying a negative DC voltage to an upper electrode provided to face the substrate support, to generate plasma from the first processing gas in the chamber; and
    (d) supplying a pulsed RF signal while continuously supplying the negative DC voltage to the upper electrode, to generate plasma from the first processing gas, wherein (c) and (d) are alternately repeated, and
    a time for performing (c) once is 30 second or shorter.

2. The substrate processing method according to claim 1, wherein a time for performing (d) once is 60 seconds or shorter.

3. The substrate processing method according to claim 1, wherein in (d), a ratio of a time period for supplying the RF signal to one cycle of the pulsed RF signal is 90% or more.

4. The substrate processing method according to claim 1, wherein in (d), a time period of one cycle of the pulsed RF signal is 50 milliseconds or shorter.

5. The substrate processing method according to claim 1, wherein in (d), a frequency of the pulsed RF signal is 20 Hz or higher.

6. The substrate processing method according to claim 1, wherein in (d), a duty ratio of the pulsed RF signal is 90% or more.

7. The substrate processing method according to claim 1, wherein in (d), an absolute value of the negative DC voltage supplied to the upper electrode in a time period during which the supply of the RF signal is cut off is larger than an absolute value of the negative DC voltage supplied to the upper electrode m a time period during which the RF signal is supplied.

8. The substrate processing method according to claim 1, wherein the substrate includes a conductive film, an insulating film provided on the conductive film, and a mask film provided on the insulating film and having a predetermined pattern formed therein.

9. The substrate processing method according to claim 8, wherein the insulating film is an oxide film, and the conductive film is a film of silicon or tungsten.

10. The substrate processing method according to claim 1, wherein the first processing gas includes a gas containing carbon and fluorine, an oxygen-containing gas, and a rare gas.

11. The substrate processing method according to claim 10, wherein the gas containing carbon and fluorine is $C_4F_8$ gas or $C_4F_6$ gas.

12. The substrate processing method according to claim 10, wherein the oxygen-containing gas is $O_2$ gas or CO gas.

13. The substrate processing method according to claim 10, wherein the rare gas is Ar gas.

14. The substrate processing method according to claim 10, further comprising:
    (e) supplying a second processing gas that includes a nitrogen-containing gas and a rare gas into the chamber, after (c) and (d) are repeated; and
    (f) supplying the RF signal into the chamber to generate plasma from the second processing gas, thereby removing polymer that remains in a hole formed in the substrate as a result of (c) and (d).

15. The substrate processing method according to claim 14, wherein the nitrogen-containing gas is $N_2$ gas, and the rare gas is Ar gas.

16. The substrate processing method according to claim 1, wherein in (c) and (d), a peak-to-peak magnitude of a voltage of the pulsed RF signal is controlled to fall within a predetermined range.

17. A substrate processing method comprising:
    (a) providing a substrate on a substrate support disposed in a chamber;
    (b) supplying a first processing gas into the chamber;
    (c) continuously supplying an RF signal into the chamber while continuously supplying a negative DC voltage to an upper electrode provided to face the substrate support, to generate plasma from the first processing gas in the chamber; and
    (d) supplying a pulsed RF signal while continuously supplying the negative DC voltage to the upper electrode, to generate plasma from the first processing gas, wherein (c) and (d) are alternately repeated, and
    a processing time for performing (c) is shorter than a processing time for performing (d).

* * * * *